(12) United States Patent
Najafi et al.

(10) Patent No.: US 11,569,816 B1
(45) Date of Patent: Jan. 31, 2023

(54) SUPERCONDUCTING SWITCH

(71) Applicant: PsiQuantum Corp, Palo Alto, CA (US)

(72) Inventors: Faraz Najafi, Palo Alto, CA (US); Qiaodan Jin Stone, Sunnyvale, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 273 days.

(21) Appl. No.: 16/840,182

(22) Filed: Apr. 3, 2020

Related U.S. Application Data

(60) Provisional application No. 62/832,212, filed on Apr. 10, 2019.

(51) Int. Cl.
| | | |
|---|---|---|
| *H01F 6/04* | (2006.01) | |
| *H01L 39/10* | (2006.01) | |
| *H01L 39/16* | (2006.01) | |
| *H03K 17/94* | (2006.01) | |
| *H01H 3/00* | (2006.01) | |

(52) U.S. Cl.
CPC ............. *H03K 17/94* (2013.01); *H01H 3/005* (2013.01)

(58) Field of Classification Search
USPC ........................................................ 307/113
See application file for complete search history.

(56) References Cited

U.S. PATENT DOCUMENTS

| | | |
|---|---|---|
| 3,059,196 A | 10/1962 | Lentz |
| 3,119,076 A | 1/1964 | Schlig et al. |
| 3,283,282 A | 11/1966 | Rosenberg |
| 4,336,561 A | 6/1982 | Murphy |
| 4,365,317 A | 12/1982 | Gheewala |
| 4,509,146 A | 4/1985 | Wang et al. |
| 4,647,954 A | 3/1987 | Graf et al. |
| 4,989,051 A | 1/1991 | Whitehead et al. |

(Continued)

FOREIGN PATENT DOCUMENTS

| | | |
|---|---|---|
| CN | 106289515 A | 1/2017 |
| CN | 106549099 | 3/2017 |

(Continued)

OTHER PUBLICATIONS

Akhlaghi et al., "Gated Mode145:149 Superconducting Nanowire Single Photon Detectors," Optics Express, vol. 20, No. 2, Jan. 16, 2012, 9 pgs.

(Continued)

*Primary Examiner* — Toan T Vu
*Assistant Examiner* — Xuan Ly
(74) *Attorney, Agent, or Firm* — Morgan, Lewis & Bockius LLP

(57) ABSTRACT

The various embodiments described herein include methods, devices, and circuits for reducing switch transition time of superconductor switches. In some embodiments, an electrical circuit includes: (i) an input component configured to generate heat in response to an electrical input; and (ii) a first superconducting component thermally-coupled to the input component. The electrical circuit is configured such that, in the absence of the electrical input, at least a portion of the first superconducting component is maintained in a non-superconducting state in the absence of the electrical input; and, in response to the electrical input, the first superconducting component transitions to a superconducting state.

18 Claims, 8 Drawing Sheets

(56) References Cited

U.S. PATENT DOCUMENTS

| | | | |
|---|---|---|---|
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,053,383 A | 10/1991 | Short et al. | |
| 5,127,928 A | 7/1992 | Farries et al. | |
| 5,173,620 A | 12/1992 | Fujimaki et al. | |
| 5,219,826 A | 6/1993 | Kapitulnik | |
| 5,247,475 A | 9/1993 | Hasunuma et al. | |
| 5,321,004 A | 6/1994 | Perez et al. | |
| 5,365,476 A | 11/1994 | Mukhanov | |
| 5,376,626 A | 12/1994 | Drehman et al. | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans | |
| 5,925,892 A | 7/1999 | Mizuno et al. | |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1 | 8/2004 | Chaudhari et al. | |
| 6,900,714 B1* | 5/2005 | Huang | H02H 7/001 505/879 |
| 7,227,438 B2 | 6/2007 | Song et al. | |
| 7,513,765 B2 | 4/2009 | Liao | |
| 7,558,030 B2 | 7/2009 | Lee et al. | |
| 7,589,323 B2 | 9/2009 | Tanaka et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,293,240 B2 | 3/2016 | Flex-Cable | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,853,645 B1 | 12/2017 | Mukhanov et al. | |
| 9,876,505 B1 | 1/2018 | Dai et al. | |
| 9,954,158 B2 | 4/2018 | You et al. | |
| 9,998,122 B2 | 6/2018 | Hamilton et al. | |
| 10,103,736 B1 | 10/2018 | Powell et al. | |
| 10,133,986 B1 | 11/2018 | Newton et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Najafi | |
| 10,262,776 B2 | 4/2019 | Choi et al. | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,454,014 B2 | 10/2019 | Najafi et al. | |
| 10,454,016 B2 | 10/2019 | Fong et al. | |
| 10,566,516 B2 | 2/2020 | Najafi | |
| 10,573,800 B1 | 2/2020 | Najafi | |
| 10,586,910 B2 | 3/2020 | Najafi | |
| 10,620,044 B2 | 4/2020 | Thompson et al. | |
| 10,651,325 B2 | 5/2020 | Najafi et al. | |
| 10,879,905 B2 | 12/2020 | Najafi et al. | |
| 10,897,235 B2 | 1/2021 | Najafi et al. | |
| 10,911,031 B2 | 2/2021 | Wise et al. | |
| 10,944,403 B2 | 3/2021 | Najafi | |
| 10,984,857 B2 | 4/2021 | Najafi | |
| 11,009,387 B2 | 5/2021 | Chung et al. | |
| 2002/0149453 A1 | 10/2002 | Snitchler et al. | |
| 2003/0087503 A1 | 5/2003 | Sakaguchi et al. | |
| 2005/0153843 A1 | 7/2005 | Kubota | |
| 2005/0197254 A1 | 9/2005 | Stasiak et al. | |
| 2006/0073979 A1 | 4/2006 | Thieme et al. | |
| 2006/0183327 A1 | 8/2006 | Moon | |
| 2006/0270224 A1 | 11/2006 | Song et al. | |
| 2008/0026234 A1 | 1/2008 | Sambasivan et al. | |
| 2008/0197285 A1 | 8/2008 | Frey et al. | |
| 2008/0272302 A1 | 11/2008 | Frey et al. | |
| 2009/0014433 A1 | 1/2009 | O'Neil et al. | |
| 2010/0026447 A1 | 2/2010 | Keefe et al. | |
| 2010/0171098 A1 | 7/2010 | Suzuki | |
| 2011/0108803 A1 | 5/2011 | Deligianni et al. | |
| 2011/0116742 A1 | 5/2011 | Chang et al. | |
| 2011/0254053 A1 | 10/2011 | Goupil et al. | |
| 2013/0012392 A1 | 1/2013 | Tanaka et al. | |
| 2013/0090244 A1 | 4/2013 | Shinzato et al. | |
| 2013/0124112 A1 | 5/2013 | Heath et al. | |
| 2013/0143744 A1 | 6/2013 | Marsili et al. | |
| 2013/0341594 A1 | 12/2013 | Mohseni et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0179916 A1 | 6/2015 | Pramanik et al. | |
| 2015/0348681 A1 | 12/2015 | Huh | |
| 2016/0028402 A1* | 1/2016 | McCaughan | H01L 39/125 505/193 |
| 2016/0028403 A1 | 1/2016 | McCughan et al. | |
| 2016/0356708 A1 | 12/2016 | Bennett et al. | |
| 2017/0186933 A1 | 6/2017 | Sunter et al. | |
| 2018/0033944 A1 | 2/2018 | Ladizinsky et al. | |
| 2018/0145664 A1 | 5/2018 | Herr et al. | |
| 2018/0335343 A1 | 11/2018 | Najafi et al. | |
| 2018/0364097 A1 | 12/2018 | Najafi | |
| 2018/0374979 A1 | 12/2018 | Nozawa | |
| 2019/0027672 A1 | 1/2019 | Megrant | |
| 2019/0035904 A1 | 1/2019 | Najafi | |
| 2019/0035999 A1 | 1/2019 | Najafi | |
| 2019/0044051 A1 | 2/2019 | Caudillo et al. | |
| 2019/0109595 A1 | 4/2019 | Najafi | |
| 2019/0148848 A1 | 5/2019 | Najafi et al. | |
| 2019/0227230 A1 | 7/2019 | Novack et al. | |
| 2019/0288132 A1 | 9/2019 | Wang et al. | |
| 2019/0378874 A1 | 12/2019 | Rosenblatt et al. | |
| 2020/0066962 A1 | 2/2020 | Najafi | |
| 2020/0080890 A1 | 3/2020 | Najafi et al. | |
| 2020/0111944 A1 | 4/2020 | Moodera et al. | |
| 2020/0176662 A1 | 6/2020 | Dayton et al. | |
| 2020/0194656 A1 | 6/2020 | Najafi | |
| 2020/0256722 A1 | 8/2020 | Najafi et al. | |
| 2021/0183767 A1 | 6/2021 | Najafi et al. | |
| 2021/0239518 A1 | 8/2021 | Chung et al. | |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H05-55647 A | 3/1993 |
| WO | WO90/14715 A1 | 11/1990 |
| WO | WO94/09566 A1 | 4/1994 |
| WO | WO/2012052628 A1 | 4/2012 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Cheng, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

(56) References Cited

OTHER PUBLICATIONS

Henrich, D. et al., "Geometry-inducted reduction of the critical current in superconducting nanowires," arXiv:1204.0616v2 [cond-mat-supr-con] Aug. 22, 2012, 6 pgs.
Hortensius, H.L. et al., "Critical-Current Reduction in Thin Superconducting Wires Due to Current Crowding," arXiv:1203.4253v3, [cond-mat-supr-con], May 6, 2012, 5 pgs.
Korzh, B.A. et al., "Demonstrating sub-3 ps temporal resolution in a superconducting nanowire single-photon detector," Apr. 18, 2018, 26 pgs.
Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).
Marsili, F., "Single-photon detectors based on ultra-narrow superconducting nanowires," Massachusetts Institute of Technology, Department of Electrical Engineering and Computer Science, Dec. 19, 2010, 31 pgs.
Mattioli, Francesco et al., "Photon-number-resolving superconducting nanowire detectors," Superconductor Science and Technology, Aug. 24, 2015, 16 pgs.
McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosophy in Electrical Engineering, 22 pgs.
Murphy et al., "Nanoscale superconducting memory based on the kinetic inductance of asymmetric nanowire loops," Departmwent of Physics, University of Illinois at Urbana-Champaign, arXiv:1701.08715v2 [cond-mat.supr-con] Jun. 29, 2017, 19 pgs.
Natarajan et al., "Superconducting nanowire single-photon detectors: physics and applications", 2012, Superconduc. Sci. Technology vol. 25, p. 063001.
Quaranta et al., Superconductive Three-Terminal Amplifier/Discriminator, IEEE Transactions on Applied Superconductivity, vol. 19, No. 3, Jun. 2, 2009, 4 pgs.
Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.
Shiino, Tatsuya et al., "Improvement of Critical Temperature of Superconducting NbTiN and NbN Thin Films Using the AIN Buffer Layer," Superconductor Science and Technology, Mar. 2010, 11 pgs.
Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.
PsiQuantum Corp., International Search Report and Written Opinion, PCT/US2018/033042, dated Aug. 28, 2018, 13 pgs.
PsiQuantum Corp., International Search Report and Written Opinion, PCT/US2018/033041, dated Jul. 27, 2018, 16 pgs.
PsiQuantum Corp., International Search Report and Written Opinion, PCT/US2018/044091, dated Nov. 7, 2018, 13 pgs.
PsiQuantum Corp., Invitation to Pay Additional Fees/Partial Search Report, PCT/US2018/037892, dated Aug. 20, 2018, 12 pgs.
PsiQuantum Corp., Invitation to Pay Additional Fees/Partial Search Report, PCT/US2018/054414, dated Jan. 24, 2019, 21 pgs.
PsiQuantum Corp., International Search Report and Written Opinion, PCT/US2018/054414, dated Mar. 20, 2019, 21 pgs.
Najafi, Office Action dated Dec. 12, 2018, U.S. Appl. No. 16/028,288, 6 pgs.
Najafi, Notice of Allowance dated Apr. 5, 2019, U.S. Appl. No. 16/028,288, 10 pgs.
Najafi, Office Action dated Sep. 21, 2018, U.S. Appl. No. 16/028,293, 8 pgs.
Najafi, Final Office Action dated Mar. 1, 2019 U.S. Appl. No. 16/028,293, 5 pgs.
Najafi, Notice of Allowance dated Sep. 21, 2018, U.S. Appl. No. 16/012,520, 9 pgs.
Najafi, Office Action, U.S. Appl. No. 16/136,124, dated Apr. 4, 2019, 9 pgs.
Najafi, Quayle Office Action, U.S. Appl. No. 16/151,180, dated Jan. 31, 2019, 5pgs.
Najafi, Notice of Allowace, U.S. Appl. No. 16/151,180, dated Mar. 14, 2019, 5 pgs.
Najafi, Notice of Allowance U.S. Appl. No. 16/151,190, dated Feb. 6, 2019, 11 pgs.
Najafi, Notice of Allowance U.S. Appl. No. 16/151,190, dated Mar. 28, 2019, 5 pgs.
Najafi, Office Action, U.S. Appl. No. 16/046,815, dated Feb. 4, 2019, 9 pgs.
Najafi, Office Action, U.S. Appl. No. 16/046,807, dated Mar. 18, 2019, 10 pgs.
Najafi, Office Action, U.S. Appl. No. 16/107,143, dated Mar. 19, 2019, 11 pgs.
PsiQuantum Corp., International Search Report and Written Opinion, PCT/US2019/017687, dated Apr. 30, 2019, 8 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019.
PsiQuantum Corp., International Search Report, PCT/US2019/017691, dated Apr. 23, 2019, 7 pgs.
PsiQuantum Corp., International Search Report and Written Opinion, PCT/US2019/030019, dated Jul. 17, 2019, 8 pgs.
PsiQuantum Corp., PCT/US2018/044091, International Preliminary Report on Patentability, dated Jan. 28, 2020, 6 pgs.
Najafi, Non-Final Office Action, U.S. Appl. No. 16/664,716, dated Apr. 1, 2020, 14 pgs.
PsiQuantum, International Search Report / Written Opinion, PCT/US2019/051853, dated Jan. 27, 2020, 13 pgs.
PsiQuantum, International Preliminary Report on Patentability, PCT/US12018/033041, dated Nov. 26, 2019, 8 pgs.
PsiQuantum, International Preliminary Report on Patentability, PCT/US2018/054414, dated Apr. 8, 2020, 15 pgs.
PsiQuantum, International Search Report / Written Opinion, PCT/US2018/037892, dated Oct. 17, 2018, 18 pgs.
PsiQuantum, International Preliminary Report on Patentability, PCT/US2018/037892, dated Dec. 17, 2019, 12 pgs.
Najafi, Non-Final Office Action, U.S. Appl. No. 16/553,068, dated Apr. 1, 2020, 11 pgs.
Najafi, Non-Final Office Action, U.S. Appl. No. 16/544,718, dated Aug. 17, 2020, 6 pgs.
Najafi, Non-Final Office Action, U.S. Appl. No. 16/656,506, dated Aug. 13, 2020, 18 pgs.
Najafi, Notice of Allowance, U.S. Appl. No. 16/553,068, dated Sep. 18, 2020, 8 pgs.
Najafi, Notice of Allowance, U.S. Appl. No. 16/473,550, dated Sep. 24, 2020, 8 pgs.
Najafi, Notice of Allowance, U.S. Appl. No. 16/473,550, dated Nov. 3, 2020, 2 pgs.
Najafi, Notice of Allowance, U.S. Appl. No. 16/553,068, dated Nov. 12, 2020, 2 pgs.
Najafi, Notice of Allowance, U.S. Appl. No. 16/656,506, dated Nov. 3, 2020, 12 pgs.
Najafi, Final Office Action, U.S. Appl. No. 16/664,716, dated Oct. 16, 2020, 14 pgs.
Najafi, Notice of Allowance, U.S. Appl. No. 16/473,547, dated Dec. 9, 2020, 8 pgs.
Najafi, Notice of Allowance, U.S. Appl. No. 16/543,256, dated Dec. 9, 2020, 12 pgs.
Chung, Non-Final Office Action, U.S. Appl. No. 16/849,829, dated Aug. 21, 2020, 5 pgs.
Chung, Notice of Allowance, U.S. Appl. No. 16/849,829, dated Dec. 8, 2020, 5 pgs.
PsiQuantum Corp., International Search Report / Written Opinion, PCT/US20/28519, dated Jan. 12, 2021, 9 pgs.
PsiQuantum Corp., Notice of Allowance, U.S. Appl. No. 16/849,829, dated Mar. 1, 2021, 8 pgs.
PsiQuantum Corp., Notice of Allowance, U.S. Appl. No. 16/544,718, dated Feb. 5, 2021, 6 pgs.
PsiQuantum Corp., Notice of Allowance, U.S. Appl. No. 16/664,716, dated Jan. 28, 2021, 8 pgs.

(56) References Cited

OTHER PUBLICATIONS

PsiQuantum Corp., Notice of Allowance, U.S. Appl. No. 16/473,547, dated Jan. 27, 2021, 2 pgs.
PsiQuantum Corp., Notice of Allowance, U.S. Appl. No. 16/543,256, dated Feb. 4, 2021, 2 pgs.
PsiQuantum Corp., Notice of Allowance, U.S. Appl. No. 16/544,718, dated Mar. 12, 2021, 2 pgs.
PsiQuantum Corp., Notice of Allowance, U.S. Appl. No. 16/544,718, dated Mar. 24, 2021, 2 pgs.
PsiQuantum Corp., Notice of Allowance, U.S. Appl. No. 16/849,829, dated Apr. 5, 2021, 2 pgs.
PsiQuantum, Notice of Allowance, U.S. Appl. No. 16/840,166, dated Mar. 23, 2021, 7 pgs.
PsiQuantum, Notice of Allowance, U.S. Appl. No. 16/544,718, dated Apr. 26, 2021, 2 pgs.
PsiQuantum, Notice of Allowance, U.S. Appl. No. 16/664,716, dated Apr. 21, 2021, 8 pgs.
PsiQuantum, Notice of Allowance, U.S. Appl. No. 16/664,716, dated May 7, 2021, 2 pgs.
PsiQuantum, Notice of Allowance, U.S. Appl. No. 16/543,256, dated Mar. 24, 2021, 2 pgs.
PsiQuantum, Notice of Allowance, U.S. Appl. No. 16/575,274, dated Apr. 22, 2021, 10 pgs.
PsiQuantum, International Preliminary Report on Patentability, PCT/US2018/033042, dated Nov. 19, 2019, 7 pgs.
PsiQuantum, International Search Report, PCT/US2018/033041, dated Jul. 27, 2018, 12 pgs.
PsiQuantum, International Preliminary Report on Patentability, PCT/US2019/051853, dated Mar. 23, 2021, 10 pgs.
PsiQuantum, International Preliminary Report on Patentability, PCT/US2019/017687, dated Aug. 18, 2020, 6 pgs.
PsiQuantum, International Preliminary Report on Patentability, PCT/US2019/030019, dated Nov. 3, 2020, 7 pgs.
PsiQuantum, Notice of Allowance, U.S. Appl. No. 16/840,166, dated May 24, 2021, 5 pgs.
Najafi, Notice of Allowance, U.S. Appl. No. 16/840,166, dated Jul. 21, 2021, 2 pgs.
Najafi, Non-Final Office Action, U.S. Appl. No. 17/135,861, dated Sep. 23, 2021, 6 pgs.
PsiQuantum, International Preliminary Report on Patentability, PCT/US2019/016885, dated Aug. 11, 2020, 7 pgs.
PsiQuantum, International Search Report and Written Opinion, PCT/US2019/016885, dated Apr. 24, 2019, 9 pgs.
Thompson, Non-Final Office Action, U.S. Appl. No. 16/450,911, dated Aug. 2, 2019, 6 pgs.
Thompson, Notice of Allowance, U.S. Appl. No. 16/450,911, dated Dec. 11, 2019, 5 pgs.
Thompson, Non-Final Office Action, U.S. Appl. No. 16/985,137, dated Sep. 30, 2021, 6 pgs.
Najafi, Notice of Allowance, U.S. Appl. No. 16/046,807, dated Oct. 29, 2019, 7 pgs.
Najafi, Non-Final Office Action, U.S. Appl. No. 16/136,124, dated Apr. 4, 2019, 8 pgs.
Najafi, Notice of Allowance, U.S. Appl. No. 16/136,124, dated Jun. 27, 2019, 8 pgs.
Najafi, Corrected Notice of Allowance, U.S. Appl. No. 16/136,124, dated Sep. 23, 2019, 2 pgs.
PsiQuantum Corp., International Search Report and Written Opinion, PCT/US2018/060802, dated Apr. 8, 2019, 6 pgs.
PsiQuantum, International Preliminary Report on Patentability, PCT/US2018/060802, dated May 19, 2020, 13 pgs.
Najafi, Notice of Allowance, U.S. Appl. No. 16/773,921, dated Sep. 22, 2021, 8 pgs.
Najafi, Notice of Allowance, U.S. Appl. No. 17/195,522, dated Nov. 12, 2021, 8 pgs.
Najafi, Notice of Allowance, U.S. Appl. No. 17/195,522, dated Nov. 16, 2021, 2 pgs.
Najafi, Notice of Allowance, U.S. Appl. No. 16/773,921, dated Nov. 15, 2021, 8 pgs.
Najafi, Notice of Allowance, U.S. Appl. No. 17/033,337, dated Dec. 9, 2021, 8 pgs.
McCaughan, A.N., et al., "Using Geometry to Sense Current," Nano Letters 16 (2016), 6 pgs.
Chung, Non-Final Office Action, U.S. Appl. No. 17/232,086, dated Dec. 16, 2021, 6 pgs.
Najafi, Notice of Allowance, U.S. Appl. No. 17/195,522, dated Dec. 9, 2021, 2 pgs.
Najafi, Notice of Allowance, U.S. Appl. No. 16/773,921, dated Dec. 24, 2021, 2 pgs.
Najafi, Notice of Allowance, U.S. Appl. No. 17/195,522, dated Jan. 7, 2022, 2 pgs.
Najafi, Notice of Allowance, U.S. Appl. No. 17/135,861, dated Jan. 28, 2022, 7 pgs.
Thompson, Non-Final Office Action, U.S. Appl. No. 16/985,137, dated Jan. 18, 2022, 8 pgs.
Najafi, Notice of Allowance, U.S. Appl. No. 16/623,503, dated Feb. 22, 2022, 10 pgs.
Najafi, Notice of Allowance, U.S. Appl. No. 17/195,522, dated Feb. 9, 2022, 2 pgs.
Najafi, Notice of Allowance, U.S. Appl. No. 17/135,861, dated Feb. 15, 2022, 2 pgs.
Najafi, Notice of Allowance, U.S. Appl. No. 16/773,921, dated Feb. 16, 2022, 2 pgs.
Najafi, Notice of Allowance, U.S. Appl. No. 17/033,337, dated Feb. 25, 2022, 7 pgs.
Najafi, Non-Final Office Action, U.S. Appl. No. 16/813,628, dated Mar. 7, 2022, 7 pgs.
Najafi, Notice of Allowance, U.S. Appl. No. 17/033,337, dated Mar. 16, 2022, 2 pgs.
Najafi, Notice of Allowance, U.S. Appl. No. 17/135,861, dated Mar. 15, 2022, 2 pgs.
Najafi, Notice of Allowance, U.S. Appl. No. 16/623,503, dated Mar. 11, 2022, 3 pgs.
Najafi, Notice of Allowance, U.S. Appl. No. 16/623,503, dated Mar. 22, 2022, 3 pgs.
Najafi, Non-Final Office Action, U.S. Appl. No. 17/160,283, dated Mar. 31, 2022, 17 pgs.
Najafi, Non-Final Office Action, U.S. Appl. No. 17/234,701, dated Feb. 1, 2022, 13 pgs.

* cited by examiner

SUPERCONDUCTING SWITCH

RELATED APPLICATIONS

This application claims priority to U.S. Provisional Application No. 62/832,212, filed Apr. 10, 2019, which is hereby incorporated by reference in its entirety.

This application is also related to U.S. application Ser. No. 16/136,124, filed Sep. 19, 2018, now U.S. Pat. No. 10,461,445, entitled "Methods and Devices for Impedance Multiplication," which is hereby incorporated by reference in its entirety.

TECHNICAL FIELD

This relates generally to superconducting circuits, including but not limited to, superconducting switch devices.

BACKGROUND

Superconductors are materials capable of operating in a superconducting state with zero electrical impedance under particular conditions. Additionally, in some circumstances, superconductors have a high impedance while in a non-superconducting state. A high impedance can be useful in many applications, such as in voltage dividers and reducing load on input signals.

SUMMARY

There is a need for circuits and devices with more efficient and effective methods for switching superconductor components. Such circuits, devices, and methods optionally complement or replace conventional systems, devices, and methods for switching superconductor components.

The present disclosure includes descriptions of circuits and devices for thermal-based coupling and impedance amplification. In accordance with some embodiments, impedance amplification is achieved by positioning two superconductors in proximity to one another such that there is no, or negligible, electrical (and quantum) coupling between the two superconductors, but there is thermal coupling between the two superconductors. In accordance with some embodiments, impedance amplification is achieved by positioning a normal conductor (e.g. made from a metal or any other resistive material) in proximity to a superconductor such that there is no, or negligible, electrical (and quantum) coupling between the normal conductor and the superconductor, but there is thermal coupling between the two. Moreover, for embodiments having two superconductors, one of the superconductors is configured so that a small input current will cause a portion of the superconductor to transition to a non-superconducting state. The transition to the non-superconducting state is accompanied by heat generation due to the resistance of the superconductor increasing when it is in the non-superconducting state. In this example, the generated heat is transferred to the second superconductor and, together with an input current applied to the second superconductor, causes the second superconductor to transition to the non-superconducting state. Moreover, in this example, the second superconductor is configured such that the non-superconducting region of the second superconductor spreads and becomes significantly larger in size than the non-superconducting portion of the first superconductor. As a result, the impedance in the second superconductor, which is triggered by the small input current on the first superconductor, is significantly larger than the impedance of the first superconductor. In other examples, the transition to the non-superconducting state of the second superconductor can be driven by heat generation that can result from a current flowing through a first non-superconducting material (e.g., a normal metal or any other resistive material).

In some embodiments, the small input current (e.g., from electrical source 104) is provided by a photodetector component (as illustrated in FIG. 6A) or a qubit component. In some embodiments, the qubit component includes a transmon qubit device, an Xmon qubit device, and/or a Josephson junction device. In some embodiments, the qubit component is coupled to the first superconductor component via a coupling circuit (e.g., resonator circuit).

In one aspect, some embodiments include an electrical circuit. The electrical circuit includes: (1) a first superconducting component; and (2) an input component thermally coupled to, and electrically insulated from, the first superconducting component, the input component electrically coupled to an electrical source to receive an electrical input from the electrical source, and the input component including: (a) a first heating component electrically coupled to the electrical source; (b) a second superconducting component thermally coupled to, and electrically insulated from, the first heating component; (c) a second heating component thermally coupled to, and electrically insulated from, the first superconducting component; (d) a resistive component; and (e) a current source electrically coupled to the second superconducting component, the second heating component, and the resistive component, such that the resistive component is coupled in parallel with a combination of the second superconducting component and the second heating component connected in series. In some embodiments, (i) in the absence of the input component receiving the electrical input, the first superconducting component is in a non-superconducting state; and (ii) the first superconducting component transitions from the non-superconducting state to a superconducting state in response to the input component receiving the electrical input. Thus, the electrical circuit operates as a logical NOT gate.

In another aspect, some embodiments include an electrical circuit that includes: (1) an input component configured to generate heat in response to an electrical input; and (2) a first superconducting component thermally coupled to the input component. In some embodiments, the electrical circuit is configured such that, (i) in the absence of the electrical input at least a portion of the first superconducting component is maintained in a non-superconducting state; and (ii) the first superconducting component transitions to a superconducting state in response to the electrical input. Thus, the electrical circuit operates as a logical NOT gate.

Thus, devices and circuits are provided with methods for reducing switching time for superconductor components, thereby increasing the effectiveness efficiency, and speed of such components.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1A:
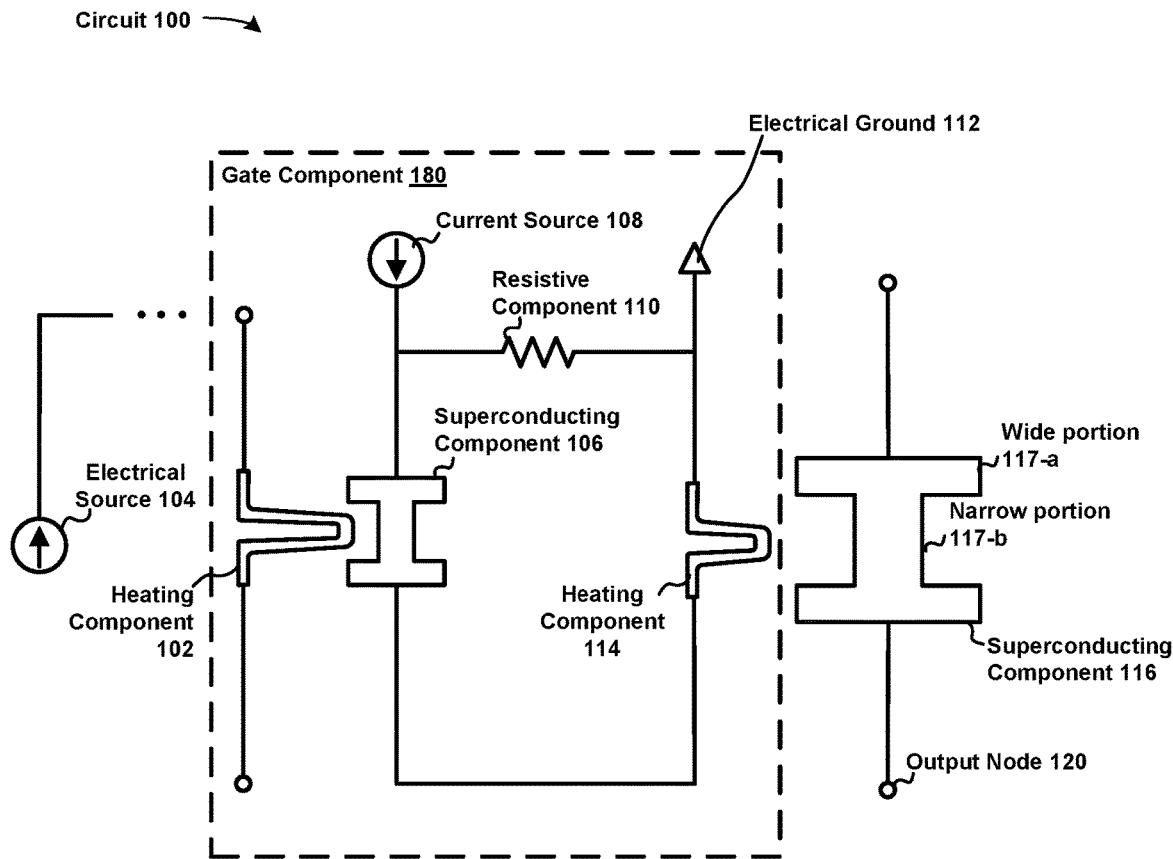
FIG. 1A is a circuit diagram illustrating a representative circuit in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

In accordance with some embodiments, superconductor components are provided that are configured to transition between superconducting and non-superconducting states in response to an input. Such superconducting components may be used as switches in electrical circuits.

As noted above, superconductors are materials capable of operating in a superconducting state with zero electrical impedance under particular conditions. For example, superconductors typically have thresholds values for temperature, current density, and applied magnetic field, above which the superconductors will operate in a non-superconducting state (e.g., a state with non-zero electrical resistance). Moreover, the presence of one of these conditions may impact the threshold for another. Thus, in some circumstances, raising the temperature of a superconductor, while still below its superconducting threshold temperature, will typically lower the superconductor's current density threshold.

Some embodiments of the present disclosure take advantage of these effects by controlling the state of a superconducting component (e.g., from the superconducting state to the non-superconducting state, or vice versa) by raising or lowering the temperature of the superconducting component, such that a current applied through the semiconductor exceeds the threshold current density in some cases but not others, thus turning the superconducting component "on" and "off" as a conductor. Stated another way, some embodiments provide thermally-assisted switching of superconducting components. This thermally-assisted switching of superconducting components can be used in devices and methods for impedance amplification, as described above in the summary.

One challenge that arises in thermally-assisted switching of superconductors is that, for a superconductor to operate in the superconducting state for large currents, the superconductor must have a suitably large size. Otherwise, the large current would exceed the threshold current density even in the absence of heating. However, the size of the superconductor impacts the superconductor's transition time for transitioning from a superconducting state to a non-superconducting state (e.g., larger size superconductors take longer to transition). Importantly, the superconductor's size has significantly less impact on the superconductor's transition time for transitioning from the non-superconducting state to the superconducting state than from the superconducting state to the non-superconducting state.

In some circumstances and embodiments, a superconductor's transition time for transitioning from a superconducting state to a non-superconducting is on the order of nanoseconds (e.g., based on the superconductor's size and geometry). That same superconductor's transition time for transitioning from the non-superconducting state to the superconducting state may be on the order of picoseconds (e.g., based on substrate cooling capacity). Therefore, it is advantageous to utilize the transition from the non-superconducting state to the superconducting state for high speed applications.

FIG. 1A is a circuit diagram illustrating a circuit 100 in accordance with some embodiments. As shown in FIG. 1A, the circuit 100 includes a superconducting component 116 electrically-coupled to an output node 120 and thermally-coupled to a gate component 180 (sometimes called an "input component"). The circuit 100 further includes an electrical source 104 (e.g., a current or voltage source) electrically-coupled to the heating component 102 (e.g., a heating element). In some embodiments, the electrical source 104 is an input circuit such as a photon detection circuit that generates a current or voltage in response to an incident photon (or set of photons).

The gate component 180 includes a heating component 114 thermally-coupled to the superconducting component 116. In accordance with some embodiments, the heating component 114 and the superconducting component 116 are sized, positioned, and configured so that heat generated by the heating component 114 is sufficient to transition the superconducting component 116 from a superconducting state to a non-superconducting state (e.g., heat applied while a current is flowing through the superconducting component 116). The gate component 180 further includes a superconducting component 106 and resistive component 110 electrically-coupled to the heating component 114 and a current source 108. As shown in FIG. 1A, the resistive component 110 is coupled in parallel with the combination of the superconducting component 106 and the heating component 114.

In some embodiments, the superconducting component 116 has a constricted region at a location adjacent to the heating component 114. For example, superconducting component 116 comprises a wide portion 117-$a$ and a narrow portion 117-$b$. The narrow portion 117-$b$ of superconducting component 116 forms the constricted region in superconducting component 116. In some circumstances, having a constricted region in superconducting component 116 reduces the thermal reaction time (both for heating and cooling) allowing the superconducting component to transition from a superconducting state to a non-superconducting state (e.g., in response heat from the heating component 114), and vice versa, faster. In some embodiments, the constricted region is 10%, 20%, or 30% narrower than the wide portion 117-a.

In accordance with some embodiments, the resistive component 110 has a resistance value that is greater than a resistance value of the combination of the superconducting component 106 and the heating component 114 while the superconducting component 106 is in a superconducting state. For example, since the superconducting component 106 has zero electrical resistance in the superconducting state, the resistance of the resistive component 110 is greater than the resistance of the heating component 114. In this way, a majority of the current from the current source 108 flows through the combination of the superconducting component 106 and the heating component 114 to the electrical ground 112 while the superconducting component 106 is in the superconducting state.

In accordance with some embodiments, the resistive component 110 has a resistance value that is less than a resistance value of the combination of the superconducting component 106 and the heating component 114 while the superconducting component 106 is in a non-superconducting state. For example, since the superconducting component 106 has a non-zero electrical resistance in the non-superconducting state, the resistance of the resistive component 110 is less than the combined resistance of the superconducting component 106 and the heating component 114. In this way, a majority of the current from the current source 108 flows through the resistive component 110 to the electrical ground 112 while the superconducting component 106 is in the non-superconducting state.

In some embodiments, the heating component 114 is composed of a superconducting material and generates heat while operating in a non-superconducting state. In some embodiments, the heating component 114 is composed of a non-superconducting material, such as a metal, metal alloy, or semiconducting material. In some embodiments, the heating component 114 includes a constricted region at a location nearest to the superconducting component 116 such that resistive heat is generated in the constricted region and transfers to the superconducting component 116.

Figure 1B:
FIG. 1B shows a side view of an electronic device that includes at least a portion of the circuit of FIG. 1A fabricated on and/or integrated with a substrate, in accordance with some embodiments.

FIG. 1B shows a side view of an electronic device 103 that includes at least a portion of the circuit 100 of FIG. 1A fabricated on and/or integrated with a substrate 105, in accordance with some embodiments. For example, the electronic device 103 includes gate component 118 and/or superconducting component 116 fabricated on and/or integrated with substrate 105. In some embodiments, electronic device 103 is operable under certain operating conditions for the electronic device 103. For example, electronic device 103 is operable while operating in a cryogenic environment. For example, although the operation of the disclosed embodiments is explained in greater detail below, in some circumstances the electronic device 103 has a range of ambient operating temperatures (e.g., below a critical temperature of the superconducting component 106 and/or the superconducting component 116). In some embodiments, as long as the ambient temperature of the electronic device 103 is maintained in the range of ambient operating temperatures, the superconducting component 116 remains in a non-superconducting state (and superconducting component 106 in a superconducting state) in the absence of the gate component 118 receiving an electrical input from electrical source 104 (FIG. 1A). In some embodiments, the ambient temperature is the temperature of substrate 105. Thus, in some embodiments, as long as the temperature of the substrate 105 (e.g., the bulk temperature of the substrate 105) is maintained in the range of ambient operating temperatures, superconducting component 116 remains in a non-superconducting state (and superconducting component 106 in a superconducting state) in the absence of the input component receiving the electrical input.

Figure 2A:
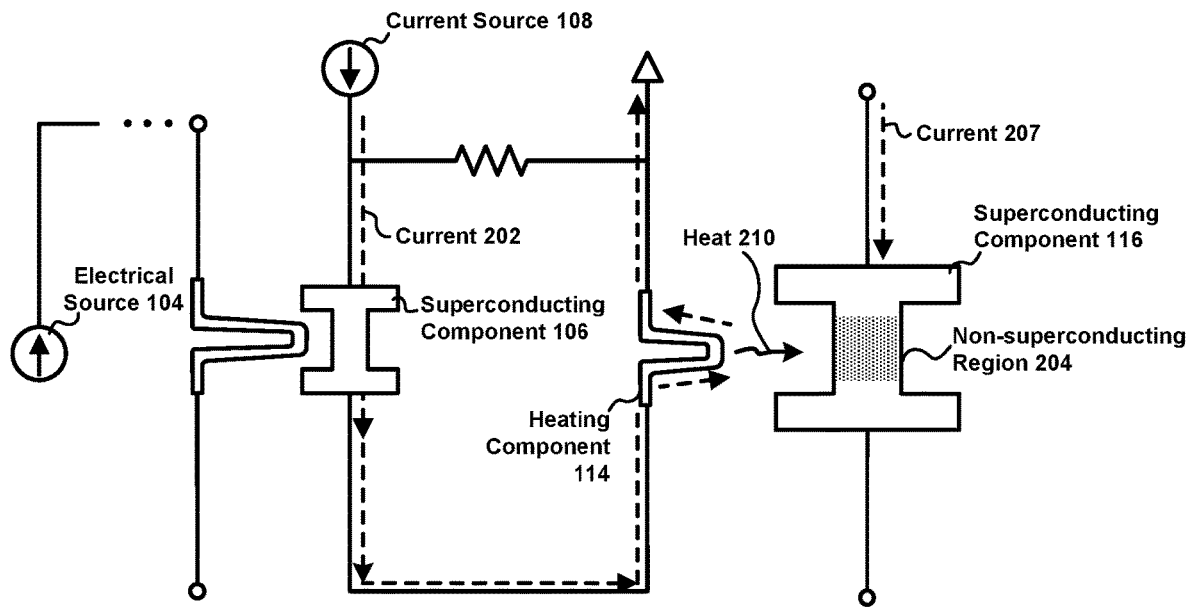
FIGS. 2A-2B are circuit diagrams illustrating representative operating states of the circuit of FIG. 1A in accordance with some embodiments.
Figure 2B:
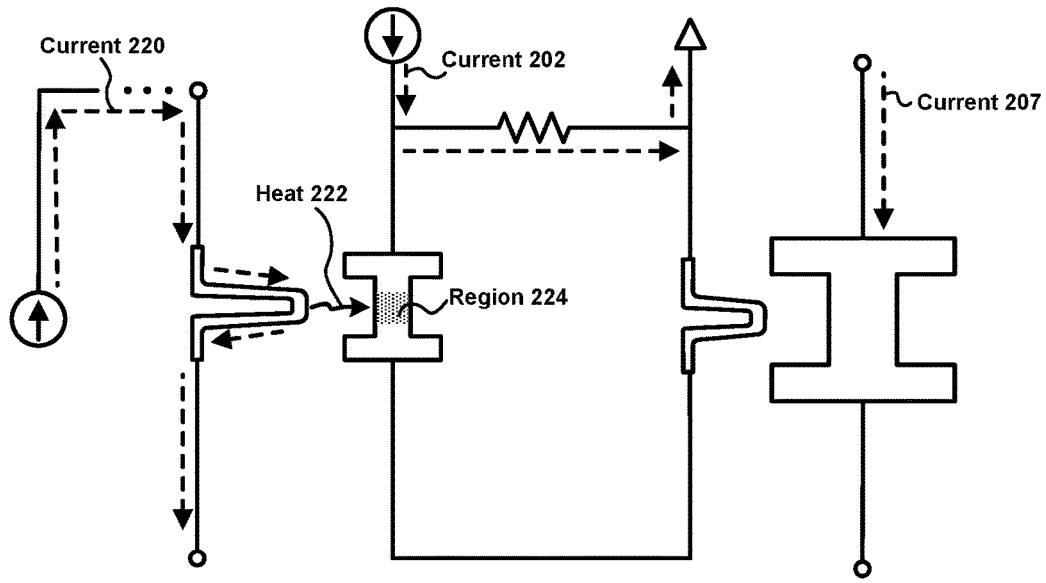

FIGS. 2A-2B are circuit diagrams illustrating representative operating states of the circuit of FIG. 1A in accordance with some embodiments. In FIG. 2A, no current is supplied be the electrical source 104. Alternatively, the electrical source 104 is supplying a current that is insufficient for the heating component 102 to generate sufficient heat to transition the superconducting component 106 from the superconducting state to the non-superconducting state. While the superconducting component 106 is operating in the superconducting state, a current 202 from the current source 108 flows through the superconducting component 106 and the heating component 114. The flow of the current 202 through the heating component 114 cause the heating component 114 to generate heat 210. The heat 210 transfers to the superconducting component 116 and, in response, a region 204 of the superconducting component 116 operates in the non-superconducting state. In accordance with some embodiments, the transferred heat lowers a superconducting current threshold for superconducting component 116 and a current 207 supplied to the superconducting component 116 exceeds the lowered threshold, thus transitioning region 204 to the non-superconducting state. Thus, in the absence of sufficient current from the electrical source 104, the superconducting component 116 operates in the non-superconducting state.

In FIG. 2B, the electrical source 104 is supplying a current 220 that is sufficient for the heating component 102 to generate sufficient heat 222 to transition the superconducting component 106 (or at least a region 224 of superconducting component 106) from the superconducting state to the non-superconducting state. While the superconducting component 106 is operating in the non-superconducting state, the current 202 from the current source 108 flows through the resistive component 110. In other words, current flowing through the heating component 114 while the superconducting component 106 is in the non-superconducting state is insufficient for the heating component 114 to generate sufficient heat to maintain the superconducting component 116 in the non-superconducting state. Cessation of the transferred heat allows the superconducting component 116 to cool and the superconducting current threshold for superconducting component 116 increases. In accordance with some embodiments, the current 207 supplied to the superconducting component 116 does not exceed the increased threshold, thus allowing transition of the region 204 back to the superconducting state. Thus, in the presence of sufficient current from the electrical source 104, the superconducting component 116 operates in the superconducting state. As shown in FIGS. 2A-2B, in response to the current 220, the superconducting component 116 transitions from the non-superconducting state to the superconducting state in accordance with some embodiments.

In some embodiments, an electrical circuit (e.g., circuit 100) includes: a first superconducting component (e.g., superconducting component 116); and a gate component (e.g., gate component 180) thermally coupled to, and electrically insulated from, the first superconducting component. In some embodiments, the gate component is electrically coupled to an electrical source (e.g., electrical source 104) to receive an electrical input from the electrical source. In some embodiments, the gate component includes: a first heating component (e.g., heating component 102) electrically coupled to the electrical source; a second superconducting component (e.g., superconducting component 106) thermally coupled to, and electrically insulated from, the first heating component; a second heating component (e.g., heating component 114) thermally coupled to, and electrically insulated from, the first superconducting component; a resistive component (e.g., resistive component 110); and a current source (e.g., current source 108) electrically coupled to the second superconducting component, the second heating component, and the resistive component, such that the resistive component is coupled in parallel with a combination of the second superconducting component and the second heating component connected in series. In some embodiments, in the absence of the gate component receiving the electrical input the first superconducting component is in a non-superconducting state (e.g., as illustrated in FIG. 2A); and the first superconducting component transitions from the non-superconducting state to a superconducting state in response to the gate component receiving the electrical input (e.g., as illustrated in FIG. 2B).

In some embodiments, an electrical circuit (e.g., circuit 100) includes: a gate component (e.g., gate component 180) configured to (e.g., under operating conditions) generate heat in response to an electrical input; and a first superconducting component (e.g., superconducting component 116) thermally coupled to the gate component. In some embodiments, the electrical circuit is configured such that, in the absence of the electrical input, at least a portion of the first superconducting component is maintained in a non-superconducting state (e.g., as illustrated in FIG. 2A); and the first superconducting component transitions to a superconducting state in response to the electrical input (e.g., as illustrated in FIG. 2B). In this way, the circuit 100 operates as a logical NOT gate (e.g., an inverter). In some embodiments, the first superconducting component is a superconducting nanowire.

In some embodiments, the gate component includes a superconducting element (e.g., superconducting component 106) configured to (e.g., under operating conditions) transition from a superconducting state to a non-superconducting state in response to the electrical input. In some embodiments, a current supplied by the electrical input exceeds a current threshold of the superconducting element. In some embodiments, the gate component includes a resistive component (e.g., resistive component 110) that generates resistive heat in response to the electrical input.

In some embodiments, the gate component includes: a first heating component (e.g., heating component 102); a second superconducting component (e.g., superconducting component 106) thermally coupled to the first heating component such that heat generated by the first heating component is transferred to the second superconducting component; and a heating component (e.g., heating component 114) electrically coupled to the second superconducting component such that: (i) while the second superconducting component is in a superconducting state, at least a threshold amount of current from a current source flows through the heating component via the second superconducting component (e.g., as illustrated in FIG. 2A), and (ii) while the second superconducting component is in a non-superconducting state, less than the threshold amount of current from the current source flows through the heating component (e.g., as illustrated in FIG. 2B). In some embodiments, the heating component is thermally coupled to the first superconducting component such that heat (e.g., heat 210) generated by the heating component in response to the threshold amount of current transfers to the first superconducting component and transitions the first superconducting component to a non-superconducting state. In some embodiments, the electrical circuit is configured such that the heat generated by the heating component is sufficient to transition the first superconducting component from a superconducting state to a non-superconducting state (e.g., as illustrated in FIG. 2A). In some embodiments, the threshold amount of current is an amount of current sufficient for the first heating component to maintain the first superconducting component in a non-superconducting state (e.g., through resistive heating).

In some embodiments, the gate component further includes: a resistor (e.g., resistive component 110) having a resistance that: (i) exceeds a combined resistance of the second superconducting component and the heating component while the second superconducting component is in the superconducting state, and (ii) does not exceed a combined resistance of the second superconducting component and the heating component while the second superconducting component is in the non-superconducting state; and a current source (e.g., current source 108) electrically coupled to the resistor, the heating component, and the second superconducting component such that the resistor is in parallel with a combination of the second superconducting component and the heating component connected in series, where the current source is configured to supply at least the threshold amount of current. In some embodiments, a reference node is coupled to the current source such that current flows from the current source to the reference node via the resistor (while the second superconducting component is non-superconducting) and via the heating component (while the second superconducting component is superconducting).

In some embodiments, the first superconducting component has a constricted region at a location adjacent to the heating component (e.g., narrow portion 117-b, FIG. 1A).

In some embodiments, the heating component has a constricted region at a location adjacent to the first superconducting component, e.g., to direct or focus heat to the superconducting component. In some embodiments, the constriction reduces width or cross section of first superconducting component by at least 10%, at least 20%, at least 30%, at least 40%, or at least 50%.

In some embodiments, the circuit further includes an electrically-insulating component (e.g., coupling component 510, FIG. 5) that thermally couples the first superconducting component and the heating component such that heat produced at the heating component is transferred through the electrically-insulating component to the first superconducting component. In some embodiments, the electrically-insulating component is an electrically-insulating, thermally-conductive connector positioned between the first superconducting component and the heating component.

Figure 3A:
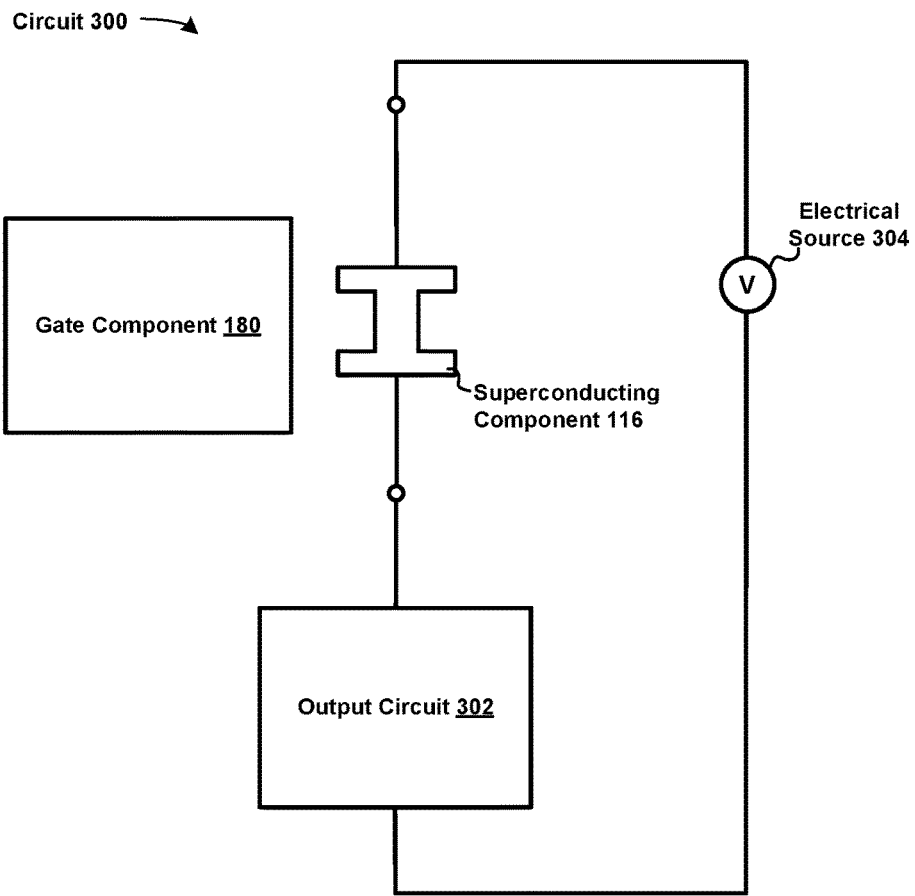
FIGS. 3A-3B are circuit diagrams illustrating representative circuits in accordance with some embodiments.

In some embodiments, the electrical circuit is configured to (e.g., under operating conditions) operate as a logical NOT gate; and a first terminal of the first superconducting component corresponds to a source of the logical NOT gate, and a second terminal of the first superconducting component corresponds to a drain of the logical NOT gate, e.g., as described and illustrated in FIG. 3A.

In some embodiments, the circuit includes an output circuit (e.g., output circuit 302, FIG. 3A) electrically coupled to the first superconducting component. In some embodiments, the output circuit is sensitive to whether the first superconducting component is in the superconducting state or the non-superconducting state (e.g., more current is directed to the output circuit when the superconducting component is in the non-superconducting state). In some embodiments, the output circuit is configured to measure an impedance, or voltage drop, of the first superconductor. In some embodiments, the output circuit is or includes a feed-forward circuit (e.g., an RC circuit (optical switch) coupled to the first superconducting component).

In some embodiments, the circuit further includes a current source (e.g., electrical source 304) electrically coupled to the first superconducting component, the current source configured to provide a first current to the first superconducting component. In some embodiments, the current source is configured to bias the first superconducting component near a superconducting threshold current such that heat from the gate component is sufficient to transition the first superconducting component to a non-superconducting state.

In some embodiments, the circuit further includes a photon detection component (e.g., represented as electrical source 104, FIG. 1A) electrically coupled to the gate component and configured to generate the electrical input in response to one or more incident photons.

Figure 3B:
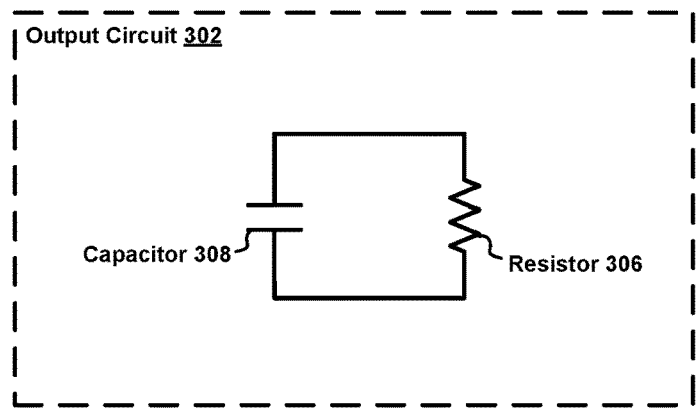

FIGS. 3A-3B are circuit diagrams illustrating representative circuits in accordance with some embodiments. FIG. 3A shows a circuit 300 that includes the gate component 180 thermally-coupled to the superconducting component 116. The circuit 300 also includes an electrical source 304 and an output circuit 302 coupled to the superconducting component 116. In accordance with some embodiments, the output circuit 302 is responsive to transitions of the superconducting component 116 (e.g., changes state based on whether the superconducting component 116 is in the superconducting state or the non-superconducting state). In some embodiments, (not shown) the output circuit 302 is coupled in parallel with the superconducting component 116. In some embodiments, the electrical source 304 is coupled in other configurations not shown, e.g., is a current source configured to supply a current to the superconducting component 116.

FIG. 3B shows components of the output circuit 302 in accordance with some embodiments. As shown in FIG. 3B, the output circuit 302 optionally includes an RC circuit, e.g., includes a capacitor 308 and a resistor 306. In some embodiments, the output circuit 302 is, or includes, an optical switch, such as the switch 616 described in FIG. 6B below. For example, in response to the superconducting component 116 transitioning from the non-superconducting state to the superconducting state, the optical switch optically-couples a first input waveguide to an output waveguide.

Figure 4:
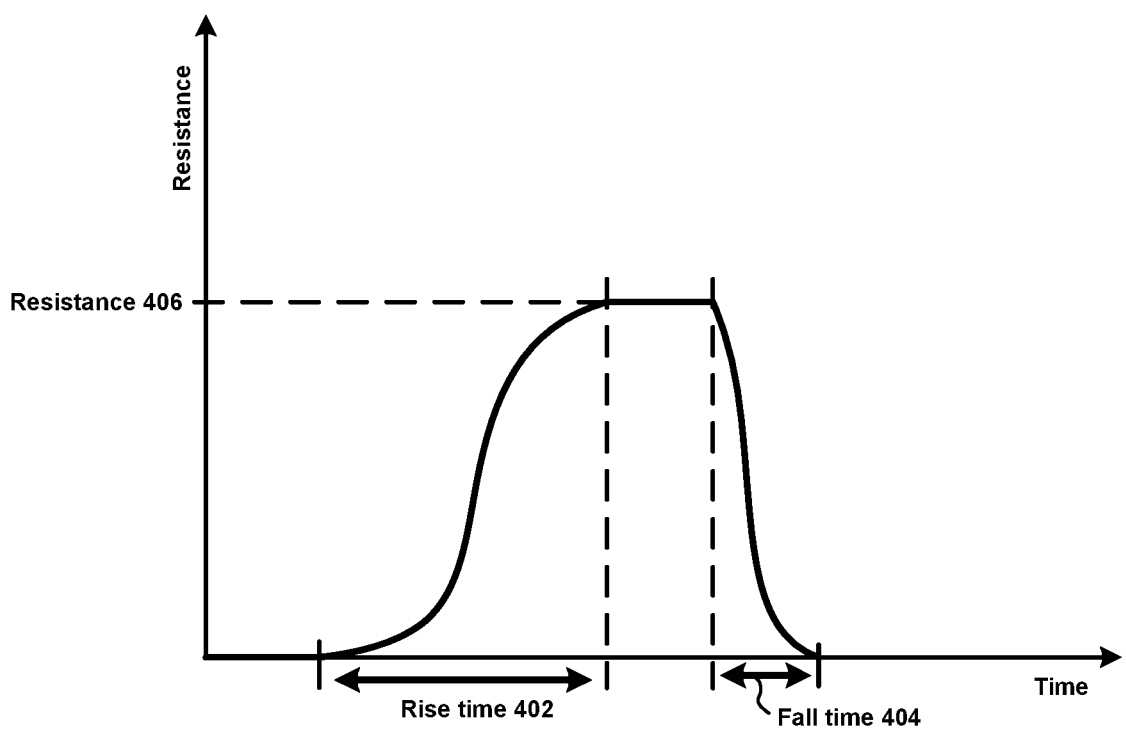
FIG. 4 is a graph illustrating representative timing for the superconducting component of FIG. 1A in accordance with some embodiments.

FIG. 4 is a graph illustrating representative timing for the superconducting component 116 of FIG. 1A in accordance with some embodiments. As shown in FIG. 4, the superconducting component 116 has an associated rise time 402, representing the time for the superconducting component 116 to transition from a superconducting state to a non-superconducting state (e.g., a state at which the superconducting component 116 has a resistance 406). The rise time 402 is based on a size of the superconducting component 116, e.g., the greater the width of the component the longer the rise time. The rise time 402 is also based on a geometry of the superconducting component, e.g., is based on current crowding effects. The superconducting component 116 also has an associated fall time 404, representing the time for the superconducting component 116 to transition from the non-superconducting state to the superconducting state. The fall time 404 is based on a cooling capacity of the superconducting device, e.g., a cooling capacity of the substrate on which the superconducting component 116 is arranged (and optionally the cooling capacity of other adjacent layers and materials). The cooling capacity of the substrate is based on their material properties. In this way, the fall time 404 is less dependent on the size and geometry of the superconducting component 116 as compared to the rise time 402.

As an example, a superconducting component having a resistance on the order of megaohms while in the non-superconducting state may have an associated rise time on the order of nanoseconds (e.g., 5-10 ns), e.g., because the rise time increases with increased resistance targets. The same superconducting component may have a fall time on the order of picoseconds (e.g., 10-100 ps), e.g., because the substrate cooling occurs concurrently throughout the superconducting component. Thus, in this example, the superconducting component operates significantly faster (e.g., 100× faster) in transitioning from the non-superconducting state to the superconducting state, as compared to transitioning from the superconducting state to the non-superconducting state.

Referring to FIG. 2B, the superconducting component 106 is optionally sized to have a rise time on the order of picoseconds, e.g., is small compared to the size of superconducting component 116. Thus, in accordance with some embodiments, in response to the current 220 from the electrical source 104, there is a rise time transition delay of 10-100 picoseconds for superconducting component 106 and a fall time transition delay of 10-100 picoseconds for the superconducting component 116 and therefore an input-output response time of the circuit 100 is 200 picoseconds or less. In embodiments in which the superconducting component 116 is sufficiently large to provide megaohms of resistance while in the non-superconducting state, the rise time transition delay of the superconducting component 116 is 5-10 ns, and thus utility the fall time transition (as illustrated in FIG. 2B) results in a significantly faster response time.

Thermal Inputs

Figure 5:
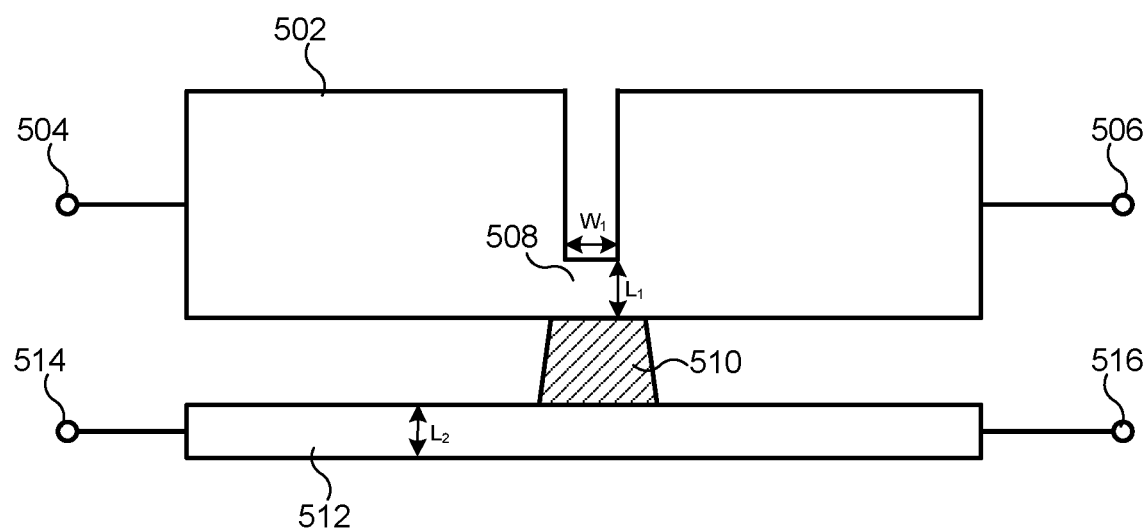
FIG. 5 is a block diagram illustrating a representative circuit in accordance with some embodiments.

FIG. 5 is a block diagram illustrating a circuit 500 in accordance with some embodiments. FIG. 5 shows the circuit 500 having a heating component 502 (e.g., the heating component 102 or 114 in FIG. 1A) and a superconducting component 512 (e.g., the superconducting component 106 or 116 in FIG. 1A). FIG. 5 further shows terminals 504 and 506 connected to the heating component 502 and terminals 514 and 516 connected to the superconducting component 512. The heating component 502 includes constricted region 508 adjacent to a coupling component 510, which thermally-couples the heating component 502 to superconducting component 512. In some embodiments, the heating component 502 is a non-superconducting component, e.g., a resistive component formed from a metal material, a semiconducting material or any other resistive material. In some embodiments, the heating component 502 is a superconductor (e.g., that selectively operates in the non-superconducting state). In some embodiments, the coupling component 510 is composed of a thermally-conductive, electrically-insulating material. In some embodiments, the coupling component 510 is composed of a same material as the superconducting component 512, but is sized such that it operates in an insulating state rather than a superconducting state. In some embodiments in which the coupling component 510 is composed of a potentially-superconducting material, the coupling component 510 has a width in the range of 5 nanometers (nm) to 20 nm. In some embodiments, the coupling component 510 is on a distinct plane from the heating component 502 and superconducting component 512. In some embodiments, the coupling component 510 is composed of a dielectric material. In some embodiments in which the coupling component 510 is composed of a non-superconducting material, the coupling component 510 has a width in the range of 5 nm to 100 nm. In some embodiments, the coupling component 510 has a length long enough so as to inhibit tunneling effects between the heating component 502 and superconducting component 512 and short enough so as to be less than a phonon's mean free path (e.g., in the range of 5 nm to 1 micron).

In some embodiments, the constricted region 508 has a width, denoted $W^1$, large enough to be able to operate in the superconducting state (e.g., greater than 10 nm) and minimized to reduce power consumption of the circuit (e.g., a width in the range of 10 nm to 200 nm). In some embodiments, the constricted region 508 has a length, denoted $L_1$, large enough to be able to operate in the superconducting state (e.g., greater than 10 nm) and minimized to reduce power consumption of the circuit (e.g., a length in the range of 10 nm to 200 nm). In some embodiments, the adjacent portions of the component 502 are sized to facilitate heat dissipation from the constricted region 508 (e.g., 5, 10, or 20 times as large as the constricted region 508). In some embodiments, the superconducting component 512 has a length, denoted $W_2$, in the range of 10 nm to 200 nm. The shapes of the superconducting components, constricted regions, and coupling components shown in FIG. 5 are intended as non-limiting examples. As one skilled in the art would recognize after reading the instant application, other geometric and irregular shapes could be used.

Photonic Systems

Figure 6A:
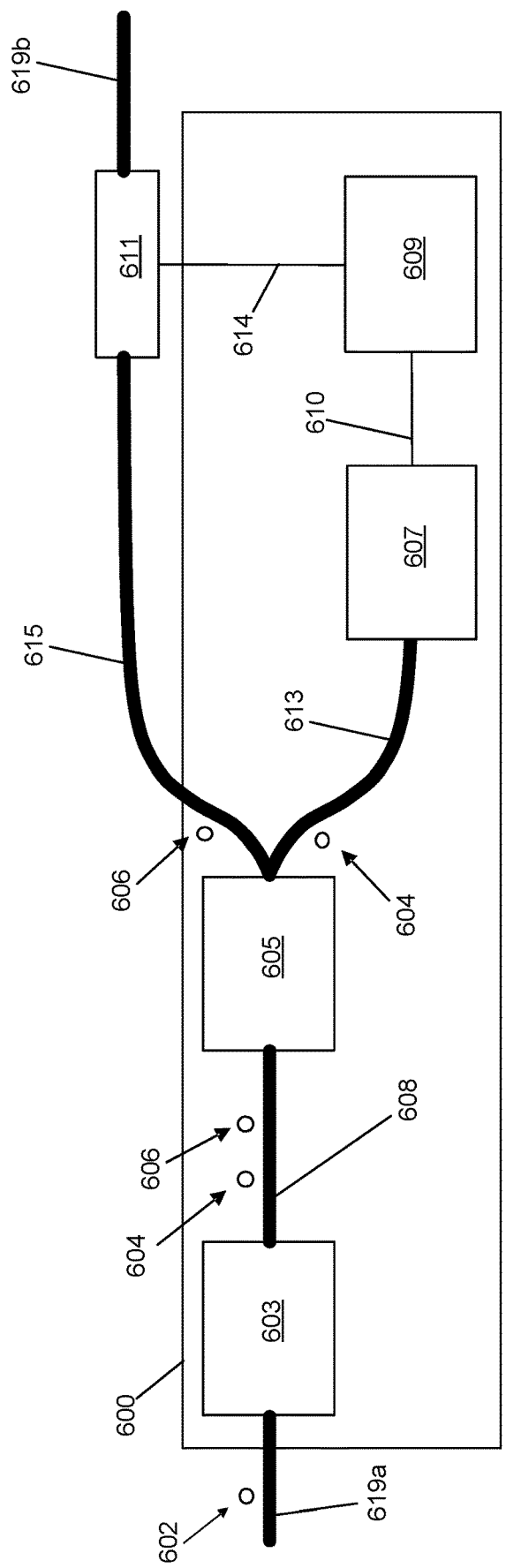
FIGS. 6A-6B illustrate a representative photonic circuit employing a superconducting switch in accordance with some embodiments.
Figure 6B:
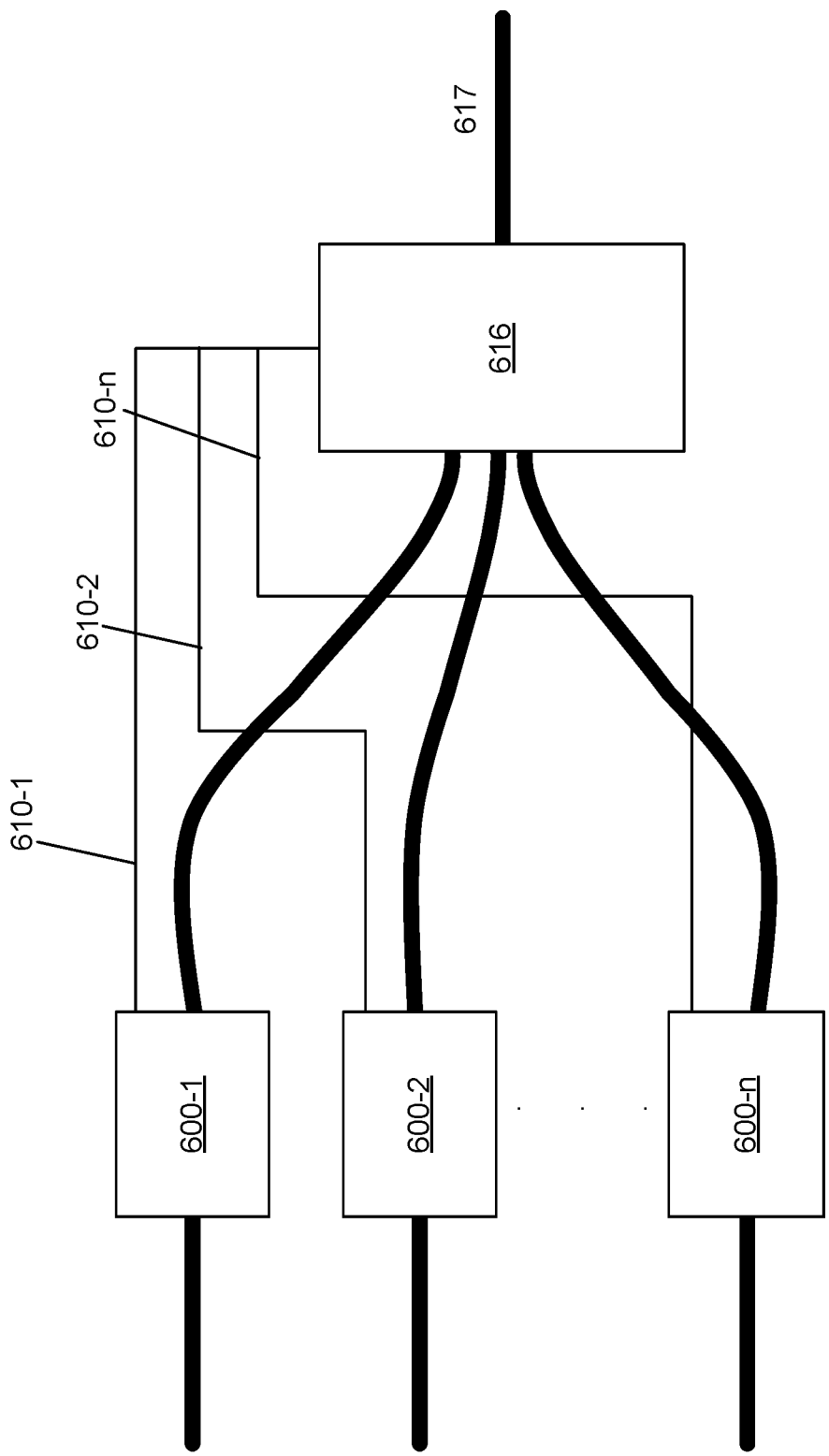

FIGS. 6A-6B show examples of a photonic system that can employ one or more superconducting circuits in accordance with one or more embodiments. In the embodiments shown in FIGS. 6A-6B, a superconducting circuit, e.g., circuit 100 or 300, and/or any of the arrangements described above can be employed as one or more superconducting switches. More specifically, the FIGS. 6A-6B illustrate a heralded single photon source in accordance with some embodiments. Such a source can be used within any system for which a source of single photons is useful, e.g., within a quantum communications system and/or a quantum computer that employs entangled photons as the physical qubits.

Turning to FIG. 6A, a heralded single photon source 600 is illustrated in accordance with some embodiments. Thick black lines in the figure represent optical waveguides and thin black lines represent electrical interconnects (e.g. wires that may be formed from superconducting or non-superconducting materials). The system is a hybrid photonic/electrical circuit that includes a pumped photon pair generator 603, a wavelength division multiplexer (WDM) 605 (which is a 1×2 WDM in this example), a superconducting photon detector 607, a superconducting amplifier circuit 609, and an optical switch 611. One or more components of the system can be housed in a cryogenic environment, such as a cryostat, held at a temperature that is lower than the threshold temperature for superconductivity, as described above.

An input optical waveguide 619a optically couples a pump photon source (not shown) to photon pair generator 603. A pump photon 602 enters the pumped photon pair generator 603 via input optical waveguide 619a. For the sake of illustration, any photons illustrated here are depicted outside of the waveguides, but one of ordinary skill will appreciate that in a physical device, these photons will propagate within one or more guided modes of the waveguide. In some embodiments, the pumped photon pair generator 603 can include a nonlinear optical material that generates two output photons, referred to as signal photon 604 and idler photon 606 from one or more input pump photons 602. For example, the pumped photon pair generator 603 can generate a pair of output photons using a process known as spontaneous four wave mixing. The pair of output photons, signal photon 604 and idler photon 606, are typically generated having different wavelengths/frequencies, e.g., with the sum of the energies of the signal and idler equal to the energy of the pump photon. After generation, signal photon 604 and idler photon 606 are optically coupled to the input of WDM 605 via waveguide 608. Because photons 604 and 606 have different wavelengths/frequencies, WDM 605 redirects each photon along a different output waveguide, e.g., signal photon 604 is directed along the heralding waveguide path 613 and idler photon 606 is redirected along the switched output waveguide path 615. Which photon is directed to which path is not critical and the path of the idler photon and signal photon can be exchanged without departing from the scope of the present disclosure.

In this example, a superconducting photon detector 607, e.g., a superconducting nanowire single photon detector, is optically coupled to the heralding waveguide path 613 and can produce an electrical signal (e.g. a current pulse, also referred to as a photon heralding signal) in response to the detection of the signal photon 604. Because the signal photon 604 and idler photon 606 were generated nearly simultaneously as a pair, the electrical signal generated by the photon detector 607 signals (i.e., "heralds") the presence of the idler photon 606 in the switched output waveguide path 615. The heralding signal is often a small amplitude current signal, e.g., microamps or less, and can be provided to the superconducting amplifier circuit 609 (e.g., the circuit 100, FIG. 1A) where it is amplified to a larger output signal that can be used to more effectively drive any downstream electronic and/or photonic circuits. Referring momentarily to the FIGS. 2A-2B described above, the small heralding signal corresponds to the current 220 (FIG. 2B) that provides a small current to the gate component 180, which results in the superconducting component 116 transitioning from the non-superconducting state to the superconducting state. The amplified signal (e.g., an output of the superconducting component 116) is then provided to the optical switch 611 (e.g., the output circuit 302, FIG. 3A) via output electrical signal line 614. Accordingly, the use of the superconducting amplifier circuit 609 provides for a system that can drive higher current loads than would be the case with photon detector 607 operating on its own. Moreover, the use of the transition of the superconducting component 116 from the non-superconducting state to the superconducting state allows for a faster switching of the optical switch 611, which reduces loss resulting from delay of the idler photon 606. After being switched, the idler photon 606 is provided via output waveguide 619b, e.g., for use in constructing a highly entangled resource state for use in a downstream optical quantum computing system (not shown).

FIG. 6B illustrates how several single photon sources similar to photon source 600 can be multiplexed to increase the reliability of the photon generation process. Such a system is beneficial because of the non-deterministic nature of the conversion between the pump photon and the photon pair in the photon pair generator 603. More specifically, because the photon pair generation process is a quantum mechanical process, it is inherently probabilistic, and thus it is not guaranteed that every pump photon that enters a photon pair generator 603 will result in the generation of a photon pair at the output. In fact, in some instances, the photon pair creation can fail entirely. Thus, to improve the reliability of the photon generation process, several single photon generators 600-1, 600-2, . . . , 600-n, each receiving its own pump photon per generation cycle, can be arranged in parallel and optically (and electrically) coupled to a N×1 switch 616, as shown. As with the heralded single photon source 600, each single photon generator 600-1, 600-2, . . . , 600-n possesses, or has an output coupled to, a corresponding dedicated heralding electrical signal line 610-1, 610-2, . . . , 610-n, which can provide a heralding signal that informs a downstream circuit element of the successful generation of a photon by that particular photon source. In some embodiments, the heralding electrical signal lines 610-1, 610-2, . . . , 610-n are electrically coupled to the N×1 switch 616. N×1 switch 616 includes digital logic that interprets the heralding electrical signals and switches the input port of the N×1 switch 616 accordingly so as to provide the generated idler photon to the output port 617. Thus, in this case, each photon source 600 includes a superconducting amplifier circuit whose internal arrangement of current sources and parallel superconducting wires provides for enough amplification to drive the logic stage of the N×1 switch. In other examples, a small signal logic circuit can be employed before the amplifier and N×1 switch. One of ordinary skill will appreciate that other arrangements are possible without departing from the scope of the present disclosure.

Figure 7:
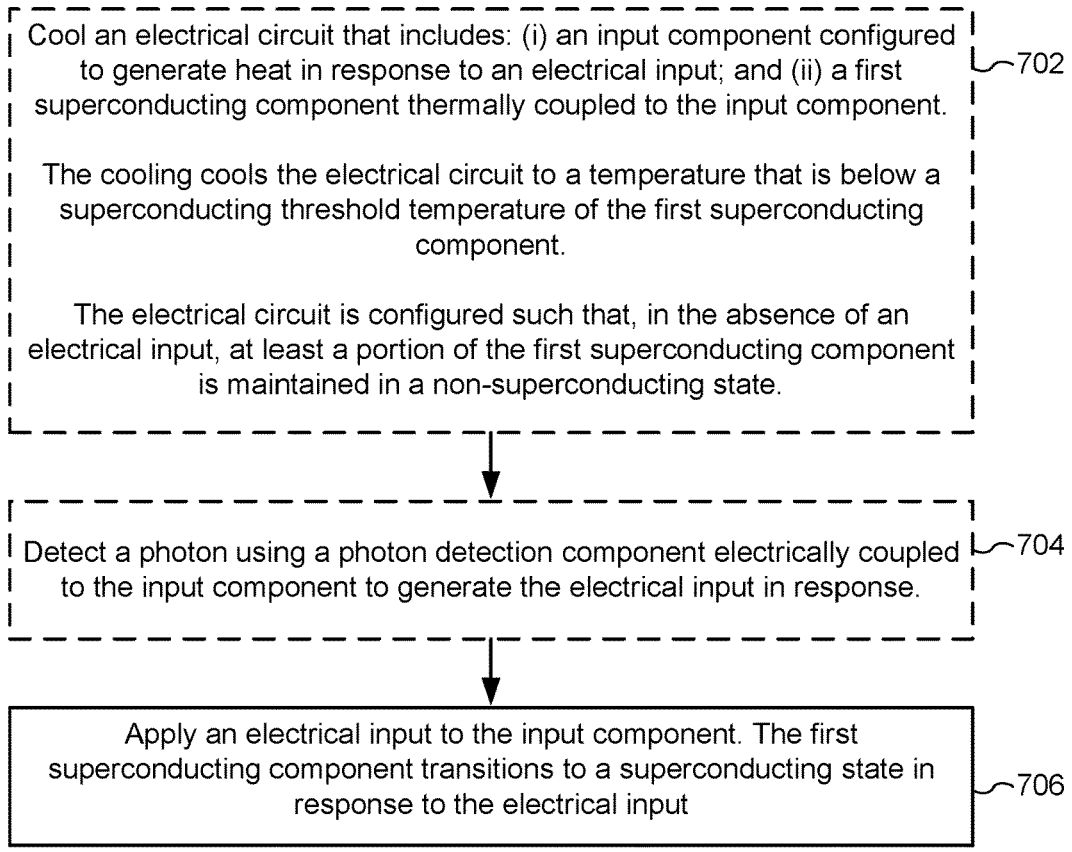
FIG. 7 is a flow chart illustrating a method of switching a superconducting component in accordance with some embodiments.

FIG. 7 is a flow chart illustrating a method 700 of switching a superconducting component in accordance with some embodiments. In some embodiments, the method is performed at an electrical circuit that includes (i) an input component configured to generate heat in response to an electrical input (e.g., gate component 118, FIGS. 1A-1B, which includes heating component 114 to generate heat); and (ii) a first superconducting component thermally coupled to the input component (e.g., superconducting component 116, FIGS. 1A-1B).

In some embodiments, method 700 includes cooling (702) the electrical circuit to a temperature that is below a superconducting threshold temperature of the first superconducting component. In some embodiments, the method includes cooling the electrical circuit temperature that is below a superconducting threshold temperature of a second superconducting component that is part of the input component (e.g., superconducting component 106, FIG. 1A). In some embodiments, the first superconducting component and the second superconducting components are made of the same material, and thus their superconducting threshold temperatures are the same. In some embodiments, cooling the electrical circuit includes cooling a substrate upon which the electrical circuit is integrated and/or fabricated (e.g., substrate 105).

In some embodiments, in the absence of the input component receiving an electrical input, the first superconducting component (or at least a portion of the first superconducting component, e.g., narrow region 117-a, FIG. 1A) is in a non-superconducting state. That is, as shown in FIGS. 2A-2B, in the absence of the input component receiving the electrical input, a heating component 114 is activated, which heats the first superconducting component into a non-superconducting state despite the fact that the ambient temperature (e.g., the temperature of the substrate) is cooled below the superconducting threshold temperature for the first superconducting component.

In some embodiments, method 700 includes detecting (704) a photon using a photon detection component electrically coupled to the input component to generate the electrical input.

Method 700 includes applying (706) the electrical input to the input component. The first superconducting component transitions to a superconducting state in response to the electrical input. For example, as shown in FIGS. 2A-2B, in response to current 220 (which may be a photocurrent or an amplified photocurrent from detecting operation 704), superconducting component 116 transitions to a superconducting state (e.g., by virtue of ambient cooling after heating component 114 is disabled by the electrical input).

As used herein, a "superconducting circuit" or "superconductor circuit" is a circuit having one or more superconducting materials. For example, a superconductor switch circuit is a switch circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also sometimes called herein a superconduction-capable material. In some embodiments, the superconducting materials operate in an "off" state where little or no current is present. In some embodiments, the superconducting materials can operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance.

As used herein, a "wire" is a section of material configured for transferring electrical current. In some embodiments, a wire includes a section of material conditionally capable of transferring electrical current. For example, a wire made of a superconducting material that is capable of transferring electrical current while the wire is maintained at a temperature below a threshold temperature. As another example, a wire made of semiconducting material is capable of transferring electrical current while the wire is maintained at a temperature above a freeze-out temperature. A cross-section of a wire (e.g., a cross-section that is perpendicular to a length of the wire) optionally has a regular (e.g., flat or round) shape or an irregular shape. While some of the figures show wires having rectangular shapes, any shape could be used. In some embodiments, a length of a wire is greater than a width or a thickness of the wire (e.g., the length of a wire is at least 5, 6, 7, 8, 9, or 10 times greater than the width and the thickness of the wire). In some cases, a wire is a section of a superconducting layer.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electrical circuit, comprising:
   an input component configured to generate heat in response to an electrical input; and
   a first superconducting component thermally coupled to the input component;
   wherein:
      the electrical circuit is configured such that, in the absence of the electrical input, at least a portion of the first superconducting component is maintained in a non-superconducting state;
      the first superconducting component transitions to a superconducting state in response to the electrical input; and
      the input component comprises:
         a first heating component;
         a second superconducting component thermally coupled to the first heating component such that heat generated by the first heating component is transferred to the second superconducting component;
         a second heating component electrically coupled to the second superconducting component such that:
            while the second superconducting component is in a superconducting state, at least a threshold amount of current from a current source flows through the second heating component via the second superconducting component, and
            while the second superconducting component is in a non-superconducting state, less than the threshold amount of current from the current source flows through the second heating component,
         wherein the second heating component is thermally coupled to the first superconducting component such that heat generated by the second heating component in response to the threshold amount of current transfers to the first superconducting component and transitions the first superconducting component to a non-superconducting state.

2. The electrical circuit of claim 1, wherein the input component further comprises:
   a resistor having a resistance that:
      exceeds a combined resistance of the second superconducting component and the second heating component while the second superconducting component is in the superconducting state, and
      does not exceed a combined resistance of the second superconducting component and the second heating component while the second superconducting component is in the non-superconducting state; and
   a current source electrically coupled to the resistor, the second heating component, and the second superconducting component such that the resistor is in parallel with a combination of the second superconducting component and the second heating component connected in series, wherein the current source is configured to supply at least the threshold amount of current.

3. The electrical circuit of claim 1, wherein the first superconducting component has a constricted region at a location adjacent to the second heating component.

4. The electrical circuit of claim 1, wherein the second heating component has a constricted region at a location adjacent to the first superconducting component.

5. The electrical circuit of claim 1, further comprising an electrically-insulating component that thermally couples the first superconducting component and the second heating component such that heat produced at the second heating component is transferred through the electrically-insulating component to the first superconducting component.

6. The electrical circuit of claim 5, wherein the electrically-insulating component is an electrically-insulating, thermally-conductive connector positioned between the first superconducting component and the second heating component.

7. The electrical circuit of claim 1, wherein the electrical circuit is configured to operate as a logical NOT gate; and
   wherein a first terminal of the first superconducting component corresponds to a source of the logical NOT gate, and wherein a second terminal of the first superconducting component corresponds to a drain of the logical NOT gate.

8. The electrical circuit of claim 1, wherein the input component comprises a superconducting element configured to transition from a superconducting state to a non-superconducting state in response to the electrical input.

9. The electrical circuit of claim 1, wherein the input component comprises a resistive component that generates resistive heat in response to the electrical input.

10. The electrical circuit of claim 1, further comprising an output circuit electrically coupled to the first superconducting component.

11. The electrical circuit of claim 10, wherein the output circuit comprises a feed-forward circuit.

12. The electrical circuit of claim 1, further comprising a current source electrically coupled to the first superconducting component, the current source configured to provide a first current to the first superconducting component.

13. The electrical circuit of claim 1, further comprising a photon detection component electrically coupled to the input component and configured to generate the electrical input in response to one or more incident photons.

14. The electrical circuit of claim 1, wherein the first superconducting component comprises a superconducting nanowire.

15. A method, comprising:
at an electrical circuit that includes:
an input component configured to generate heat in response to an electrical input; and
a first superconducting component thermally coupled to the input component;
wherein:
the electrical circuit is configured such that, in the absence of the electrical input, at least a portion of the first superconducting component is maintained in a non-superconducting state; and
the input component comprises:
a first heating component;
a second superconducting component thermally coupled to the first heating component such that heat generated by the first heating component is transferred to the second superconducting component;
a second heating component electrically coupled to the second superconducting component such that:
while the second superconducting component is in a superconducting state, at least a threshold amount of current from a current source flows through the second heating component via the second superconducting component, and
while the second superconducting component is in a non-superconducting state, less than the threshold amount of current from the current source flows through the second heating component; and
wherein the second heating component is thermally coupled to the first superconducting component such that heat generated by the second heating component in response to the threshold amount of current transfers to the first superconducting component and transitions the first superconducting component to a non-superconducting state:
applying an electrical input to the input component, wherein the first superconducting component transitions to a superconducting state in response to the electrical input.

16. The method of claim 15, further including:
cooling the electrical circuit to a temperature that is below a superconducting threshold temperature of the first superconducting component.

17. The method of claim 15, wherein applying an electrical input to the input component includes detecting a photon using a photon detection component electrically coupled to the input component to generate the electrical input in response.

18. An electrical circuit, comprising:
a first superconducting component; and
an input component thermally coupled to, and electrically insulated from, the first superconducting component, the input component electrically coupled to an electrical source to receive an electrical input from the electrical source, and the input component comprising:
a first heating component electrically coupled to the electrical source;
a second superconducting component thermally coupled to, and electrically insulated from, the first heating component;
a second heating component thermally coupled to, and electrically insulated from, the first superconducting component;
a resistive component; and
a current source electrically coupled to the second superconducting component, the second heating component, and the resistive component, such that the resistive component is coupled in parallel with a combination of the second superconducting component and the second heating component connected in series; and
wherein, in the absence of the input component receiving the electrical input, the first superconducting component is in a non-superconducting state; and
wherein, in response to the input component receiving the electrical input, the first superconducting component transitions from the non-superconducting state to a superconducting state.

* * * * *